US011245555B1

(12) United States Patent
Delshadpour

(10) Patent No.: US 11,245,555 B1
(45) Date of Patent: Feb. 8, 2022

(54) WIDEBAND PASSIVE BUFFER WITH DC LEVEL SHIFT FOR WIRED DATA COMMUNICATION

(71) Applicant: NXP B.V., Eindhoven (NL)

(72) Inventor: Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/086,241

(22) Filed: Oct. 30, 2020

(51) Int. Cl.
*H04L 25/03* (2006.01)
*H03F 3/45* (2006.01)

(52) U.S. Cl.
CPC ... *H04L 25/03949* (2013.01); *H03F 3/45085* (2013.01); *H03F 3/45183* (2013.01)

(58) Field of Classification Search
CPC ............. H03F 3/45183; H03F 3/45085; H04L 25/03949
See application file for complete search history.

(56) References Cited

U.S. PATENT DOCUMENTS

| 7,385,426 | B1* | 6/2008 | Wan | H03F 3/45179 326/115 |
| 7,400,196 | B2 | 7/2008 | Wyatt | |
| 10,447,507 | B1 | 10/2019 | Zhang et al. | |
| 2020/0153395 | A1 | 5/2020 | Geng et al. | |

OTHER PUBLICATIONS

Gondi, Srikanth et al.; "Equalization and Clock and Data Recovery Techniques for 10-GB/s CMOS Serial Link Recievers"; IEEE Journal of Solid State Circuits, vol. 42, No. 9; Sep. 2007, 13 pages.
"Universal Serial Bus 3.2 Specifications, Revision 1.0"; Sep. 2017, 528 pgs.
U.S. Appl. No. 17/084,528; 23 pages (filed Oct. 29, 2020).

* cited by examiner

*Primary Examiner* — Rahel Guarino

(57) ABSTRACT

Embodiments of a passive buffer circuit and a wideband communication circuit that uses the passive buffer circuit are disclosed. In an embodiment, the passive buffer circuit includes buffer elements connected between input terminals and output terminals that are connected to input terminals of a communication component circuit with a plurality of input transistors. Each of the buffer elements provides a first path with a resistor and a second path with a series-connected capacitor and inductor. The passive buffer circuit further includes current sources connected between the output terminals and at least one fixed voltage and a feedback loop from the input transistors to the current sources to control direct current (DC) voltage at each of the input terminals of the communication component circuit. The feedback loop includes an error amplifier that controls the current sources based on voltages on the input transistors with respect to a reference voltage.

20 Claims, 9 Drawing Sheets

WIDEBAND PASSIVE BUFFER WITH DC LEVEL SHIFT FOR WIRED DATA COMMUNICATION

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO, also known as USB4) and any other high-speed communication applications often include stages of processing within their electronic circuitry.

Wideband wired data communications system circuitry can include several stages including modules to equalize, amplify and/or re-drive signals for its data channels. Usually one stage cannot provide enough gain or equalization. In such multi-stage systems, the use of intermediate buffers between each stage may be advantageous. Buffers can act as a level shifter between an input stage and internal stages as a CTLE, or between an internal stage and an output stage to avoid loading out the output stage on any internal stage to have better PVT control on high-speed performances. A buffer can also function as an interface between input pin, which must show a 50Ω termination, and a CTLE.

Oftentimes, however, the buffer may consume even more power than the equalizer, amplifier and drivers, which makes a buffer block design more critical in the system, especially for use in low voltage (e.g., ~1.8V or lower) systems. What are needed are improvements in wide bandwidth communication circuitry that reduce the power consumption and lead to more efficiency.

SUMMARY

Embodiments of a passive buffer circuit and a wideband communication circuit that uses the passive buffer circuit are disclosed. In an embodiment, the passive buffer circuit includes buffer elements connected between input terminals and output terminals that are connected to input terminals of a communication component circuit with a plurality of input transistors. Each of the buffer elements provides a first path with a resistor and a second path with a series-connected capacitor and inductor. The passive buffer circuit further includes current sources connected between the output terminals and at least one fixed voltage and a feedback loop from the input transistors to the current sources to control direct current (DC) voltage at each of the input terminals of the communication component circuit. The feedback loop includes an error amplifier that controls the current sources based on voltages on the input transistors with respect to a reference voltage.

In an embodiment, the feedback loop is connected to the input transistors of a continuous-time linear equalizer (CTLE) and the output terminals of the passive buffer circuit are connected to control terminals of the input transistors of the CTLE.

In an embodiment, the feedback loop further includes first and second resistors that are connected in parallel, each of the first and second resistors being connected between a first input of the error amplifier and one of the input transistors of the communication component circuit.

In an embodiment, the passive buffer circuit further includes a reference voltage circuit connected to the error amplifier, the reference voltage circuit including a reference voltage current source and a first resistor connected in series between a supply voltage and a fixed voltage, wherein a node between the reference voltage current source and the first resistor is connected to an input of the error amplifier.

In an embodiment, the reference voltage circuit further includes a transistor connected between the reference voltage current source and the first resistor.

In an embodiment, the passive buffer circuit further includes a first resistor connected between one of the current sources and one of the output terminals and a second resistor connected between another one of the second current sources and another one of the output terminals.

In an embodiment, the passive buffer circuit further includes a switch connected to an output of the error amplifier and a supply voltage to provide a safe mode input resistance when needed.

In an embodiment, each of the input terminals of the passive buffer circuit is connected to a termination resistor.

In an embodiment, a wideband communication circuit includes a passive buffer circuit with input terminals to receive input signals and output terminals to transmit output signals, and a continuous-time linear equalizer (CTLE) with a plurality of input transistors connected to the output terminals of the passive buffer circuit to equalize the output signals from the passive buffer circuit. The passive buffer circuit includes a plurality of buffer elements connected between the input terminals of the passive buffer circuit and the output terminals of the passive buffer circuit. The output terminals of the passive buffer circuit are connected to input terminals of the CTLE. Each of the buffer elements provides a first path with a resistor and a second path with a series-connected capacitor and inductor for signals from the input terminals of the passive buffer circuit to the input terminals of the CTLE. The passive buffer circuit further includes a plurality of current sources connected between the output terminals and at least one fixed voltage, and a feedback loop from the input transistors of the CTLE to the current sources to control direct current (DC) voltage at each of the input terminals of the CTLE. The feedback loop includes an error amplifier that controls the current sources based on voltages on the input transistors of the CTLE with respect to a reference voltage.

In an embodiment, the output terminals of the passive buffer circuit are connected to control terminals of the input transistors of the CTLE.

In an embodiment, the feedback loop of the passive buffer circuit further includes first and second resistors that are connected in parallel. Each of the first and second resistors is connected between a first input of the error amplifier and one of the input transistors of the CTLE.

In an embodiment, the passive buffer circuit further includes a reference voltage circuit connected to the error amplifier. The reference voltage circuit includes a reference voltage current source and a first resistor connected in series between a supply voltage and a fixed voltage, wherein a node between the reference voltage current source and the first resistor is connected to an input of the error amplifier.

In an embodiment, the reference voltage circuit of the passive buffer circuit further includes a transistor connected between the reference voltage current source and the first resistor.

In an embodiment, the passive buffer circuit further includes a first resistor connected between one of the current sources and one of the output terminals and a second resistor connected between another one of the current sources and another one of the output terminals.

In an embodiment, the passive buffer circuit further includes a switch connected to an output of the error amplifier and a supply voltage to provide a safe mode input resistance when needed.

In an embodiment, each of the input terminals of the passive buffer circuit is connected to a termination resistor.

In an embodiment, a passive buffer circuit includes first and second buffer elements connected between first and second input terminals of the passive buffer circuit and first and second output terminals of the passive buffer circuit. The first and second output terminals of the passive buffer circuit are connected to input terminals of a communication component circuit with first and second input transistors. Each of the first and second buffer elements provides a first path with a resistor and a second path with a series-connected capacitor and inductor for signals from the first and second input terminals of the passive buffer circuit to the input terminals of the communication component circuit. The passive buffer circuit further includes first and second current sources connected between the first and second output terminals and at least one fixed voltage, and a feedback loop from the first and second input transistors of the communication component circuit to the current sources to control direct current (DC) voltage at each of the inputs of the communication component circuit. The feedback loop includes an error amplifier and first and second feedback loop resistors. The first feedback loop resistor is connected to the first input transistor of the communication component circuit and to a first input of the error amplifier. The second feedback loop resistor is connected to the second input transistor of the communication component circuit and to the first input of the error amplifier. A voltage on the first input of the error amplifier is compared to a reference voltage on a second input of the error amplifier to output an error signal to control the current sources based on voltages on the first and second input transistors of the communication component circuit with respect to the reference voltage.

In an embodiment, the feedback loop is connected to the first and second input transistors of a continuous-time linear equalizer (CTLE) and the first and second output terminals of the passive buffer circuit are connected to control terminals of the input transistors of the CTLE.

In an embodiment, the passive buffer circuit further includes a reference voltage circuit connected to the error amplifier. The reference voltage circuit includes a reference voltage current source and a first resistor connected in series between a supply voltage and a fixed voltage, wherein a node between the reference voltage current source and the first resistor is connected to the second input of the error amplifier.

In an embodiment, the passive buffer circuit further includes a switch connected to an output of the error amplifier and a supply voltage to provide a safe mode input resistance when needed.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
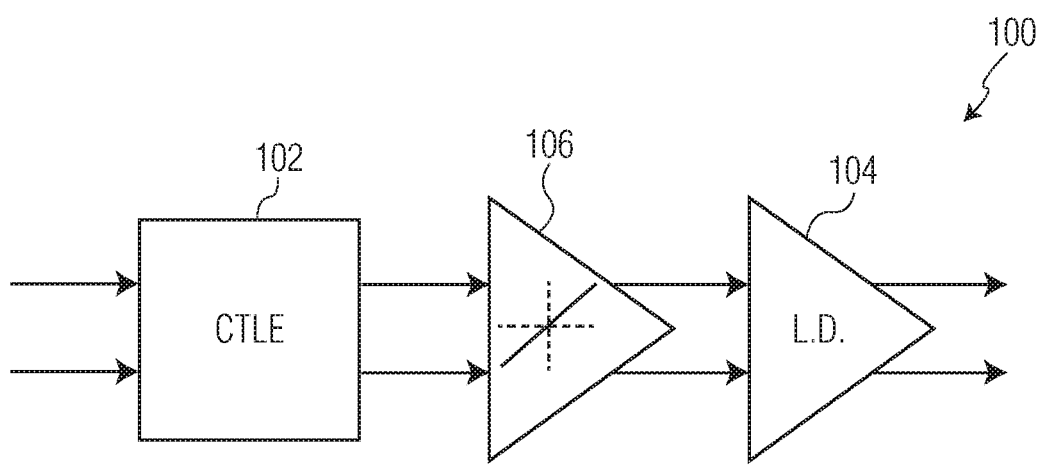
FIG. 1 is a block diagram of a linear redriver in accordance with prior art.

FIG. 1 illustrates a typical architecture of a linear redriver 100 in accordance with prior art. The linear redriver 100 includes a continuous-time linear equalizer (CTLE) 102 to equalize input signals and a linear transmitter (TX) line driver 104 to retransmit the signals based on signal standard specifications. Due to gain variation over PVT (process, voltage and temperature) and significant parasitic loadings from the transmitter (not shown in FIG. 1), a gain stage 106 may be needed between the CTLE 102 and the TX line driver 104. The gain stage 106 can be a programmable gain amplifier (PGA) or an automatic gain control (AGC) stage. Depending on the design, the programmable gain stage can stay or be eliminated.

Figure 2:
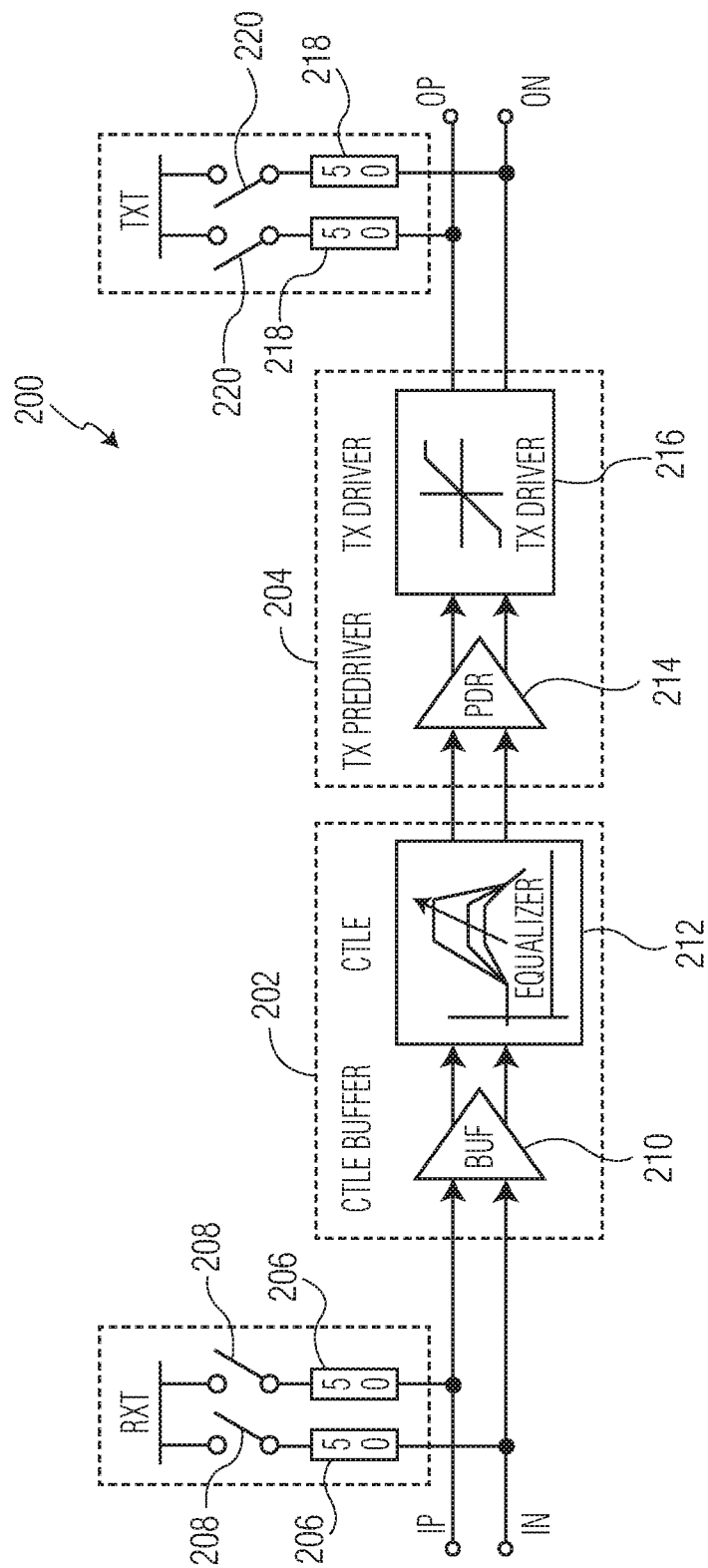
FIG. 2 is a block diagram of a wideband wired communication circuit in the form of a linear redriver without the need of a gain stage in which embodiments of the invention may be implemented.

Turning now to FIG. 2, a wideband wired communication circuit in the form of a linear redriver 200 without the need of a gain stage in which embodiments of the invention may be implemented is illustrated. As shown in FIG. 2, the linear redriver 200, which can be used in, for example, USB/HDMI/DP/Thunderbolt/PCIe/CIO/PAM4 data communication paths, includes an equalization block 202 that receives input signals at input terminals IP and IN and a transmission block 204 that outputs signal at output terminals OP and ON. The equalization block 202 includes a CTLE 212, while the transmission block 204 includes a TX driver 216. The TX driver 216 operates to drive a termination load disposed at a TX driver output. Output from the TX driver 216 typically drives 50-Ohm load terminations 218 at its outputs, which are each connected to a switch 220. The 50-Ohm load terminations 218 and the associated switches 220 are shown as a Transmit Termination (TXT) within the dashed box positioned after the transmission block 204. Similar 50-Ohm loads 206 can also be found to affect the inputs of the equalization block 202, which are also each connected to a switch 208. The 50-Ohm termination resistors 206 and the associated switches 208 are shown as a Receive Termination (RXT) within the dashed box positioned before the equalization block 202. A CTLE buffer 210 (BUF), which is designed in accordance with embodiments of the invention, can be disposed inline before the CTLE 212 to isolate the CTLE from the inputs and set a certain direct current (DC) level for the CTLE. A TX pre-driver buffer 214 (PDR) can be disposed inline after the CTLE 212 and before the TX driver 216. A buffer circuit described herein in accordance with embodiments of the invention may be used as the CTLE buffer 210 and/or the TX pre-driver buffer 214.

The TX driver 216 can be provided as a simple differential pair to drive what is typically a 50-Ohm termination (see FIG. 2, 50-Ohm load terminations 218 or 50-Ohm load of the next stage). But this can call for the differential pair transistors to be relatively large devices. Furthermore, parasitic capacitors of the TX driver 216 and routing may load the CTLE 212 and impact its performance. As a result, the TX pre-driver buffer 214 may be needed to isolate the CTLE 212 from the TX driver 216 and drive the long routing path from the CTLE to the TX driver. The TX pre-driver buffer 214 may also provide the right or desired DC level for the TX driver inputs.

The redriver 200 is illustrated using 50-Ohm terminations 206 to supply as the input terminations. Thus, any circuit required for the redriver 200 needs to work with higher DC level. In the case of termination to ground, the circuit needs to work with lower DC levels. The CTLE buffer 210 will be able to adjust the DC level for the CTLE input to avoid using high DC level for it. Similarly, the TX pre-driver buffer 214 can make a DC level adjustment for the TX driver 216 if needed.

Figure 3:
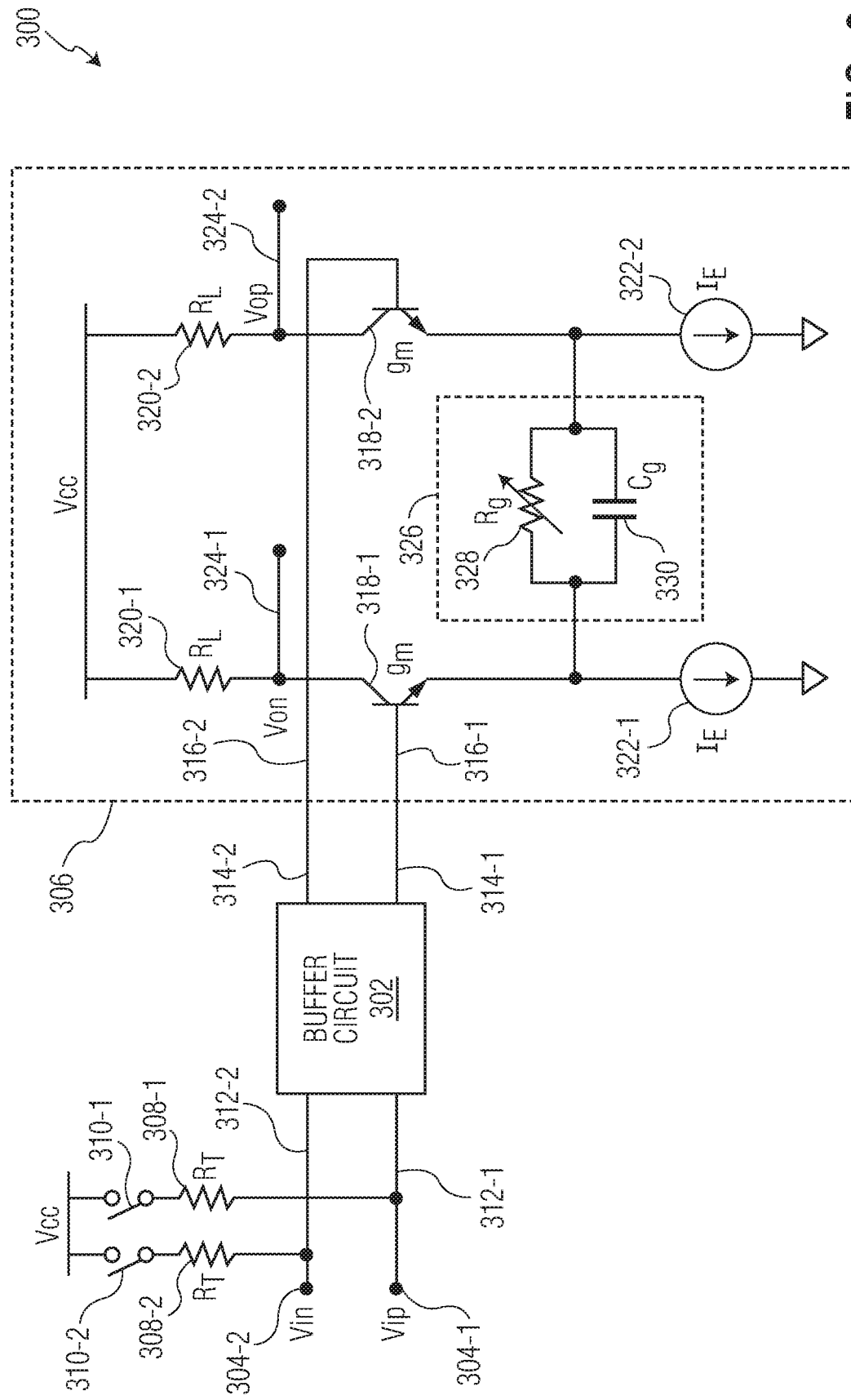
FIG. 3 is a circuit diagram of an input stage of a wideband communication circuit in which embodiments of the invention can be implemented.

Turning now to FIG. 3, an input stage 300 of a wideband communication circuit, such as a receiver, in which embodiments of the invention can be implemented is shown. The input stage 300 includes a buffer circuit 302 with level shifting disposed between input pins and a communication component circuit, e.g., a CTLE 306, where termination resistors 308-1 and 308-2 with a resistance value of $R_T=50\Omega$ termination are connected to the input pins and to supply voltage $V_{CC}$ via switches 310-1 and 310-2. The termination resistors 308-1 and 308-2 can be connected ground depending on the design strategy and employed technology. The buffer circuit 302 isolates the CTLE 306 from the input pins 304-1 and 304-2, which means that the buffer circuit needs to be high bandwidth and be able to shift DC voltage of signals to desire value for the CTLE. The buffer circuit 302 includes input terminals 312-1 and 312-2 that are connected to the input pins 304-1 and 304-2, and output terminals 314-1 and 314-2 that are connected to input terminals 316-1 and 316-2 of the CTLE 306.

The CTLE 306 shown in FIG. 3 includes a pair of bipolar transistors 318-1 and 318-2 connected to supply voltage $V_{CC}$ via resistors 320-1 and 320-2 with a resistance value of $R_L$. The transistors 318-1 and 318-2 are also connected to a fixed voltage, e.g., ground, via current sources 322-1 and 322-2, each of which provides current $I_E$. The bases of the transistors 318-1 and 318-2 are connected the input terminals 316-1 and 316-2, which are connected to the output terminals 314-1 and 314-2 of the buffer circuit 302, to receive output signals from the buffer circuit. The collector of the transistor 318-1 is connected to an output terminal 324-1 of the CTLE 306, while the collector of the transistor 318-2 is connected to the other output terminal 324-2 of the CTLE 306. Each of the transistors 318-1 and 318-2 has a transconductance of $g_m$.

The CTLE 306 further includes an impedance element 326 connect to the emitters of the transistors 318-1 and 318-2. As shown in FIG. 3, the impedance element 326 includes a resistor 328 with a resistance value of $R_g$ and a capacitor 330 with a capacitance value of $C_g$, which are connected in parallel. In an embodiment, the resistor 328 is a variable resistor.

The CTLE 306 is a conventional CTLE with $R_g/C_g$ degeneration impedance that can provide different CTLE peaking gain by programming or changing $R_g$. However, in other embodiments, the CTLE 306 may have a different architecture, for example, a two-dimensional CTLE architecture or conventional CTLE with different type of termination, for example inductive termination in series with $R_L$.

A conventional way of implementing the buffer circuit 302 with level shifting capabilities is an active circuit which has wide bandwidth and shifts DC level to the desired value for the CTLE. Considering speed of 5-10-20 GHz for the CTLE, depending on the technology and application, an active buffer can consume milliampere range current (e.g., 10-20 mA) which is a considerable amount for low power applications.

Figure 4:
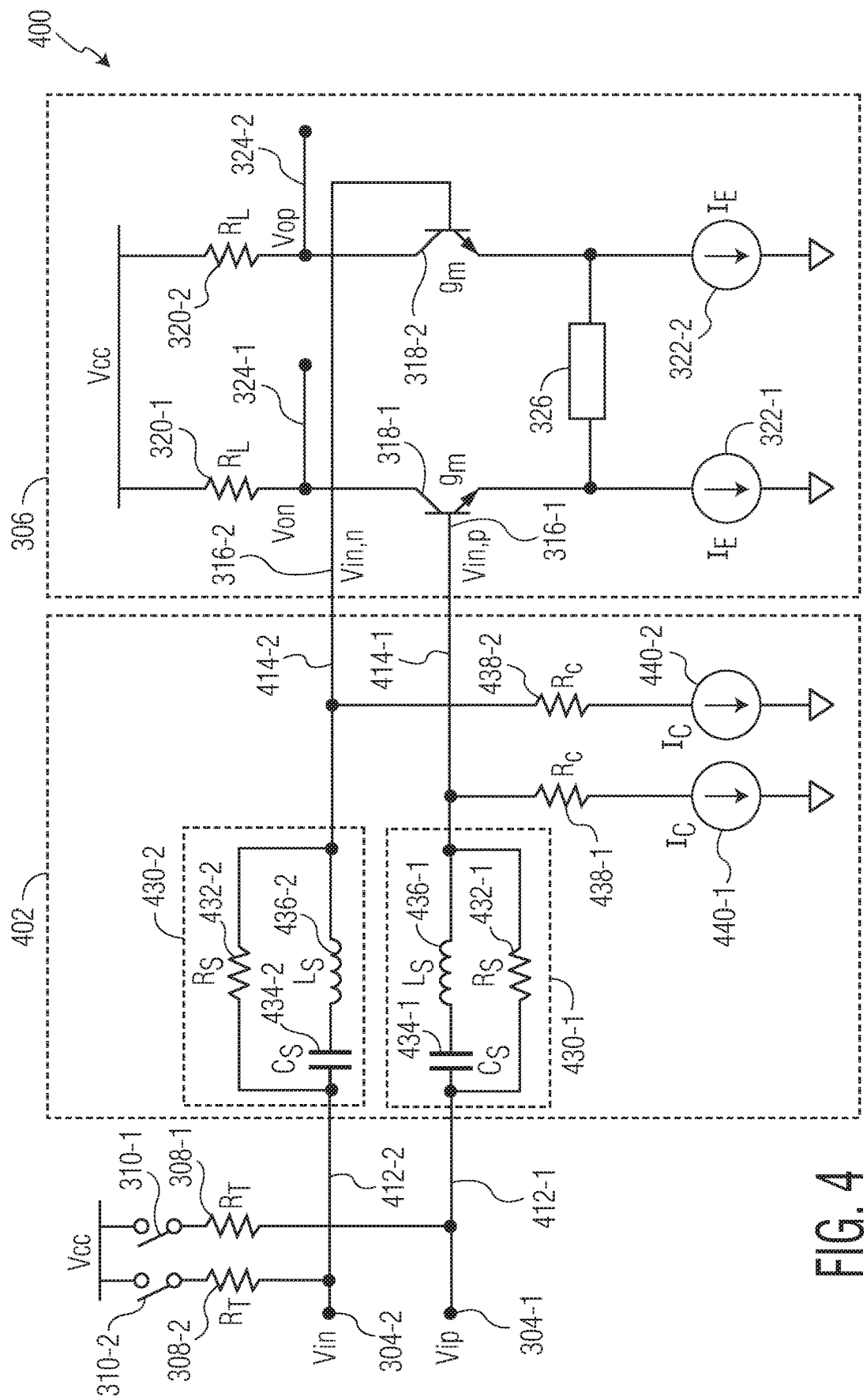
FIG. 4 is a circuit diagram of an input stage of a wideband communication circuit with a passive high bandwidth buffer circuit in accordance with an embodiment of the invention.

FIG. 4 shows the input stage 400 of a wideband communication circuit with a passive high bandwidth buffer circuit 402 in accordance with an embodiment of the invention. The passive buffer circuit 402 includes a pair of buffer elements 430-1 and 430-2 connected to input terminals 412-1 and 412-2 and output terminals 414-1 and 414-2 of the passive buffer circuits. The buffer element 430-1 includes a resistor 432-1 with a resistance value of $R_S$, a capacitor 434-1 with a capacitance of $C_S$, and an inductor 436-1 with an inductance value of $L_S$, where the capacitor 434-1 and the inductor 436-1 are connected in series, and are parallel to the resistor 432-1. Similarly, the buffer element 430-2 includes a resistor 432-2 with a resistance value of $R_S$, a capacitor 434-2 with a capacitance of $C_S$, and an inductor 436-2 with an inductance value of $L_S$, where the capacitor 434-2 and the inductor 436-2 are connected in series, and are parallel to the resistor 432-2. The passive buffer circuit 402 further includes a resistor 438-1 with a resistance value of $R_C$ and a current source 440-1 that are connected in series between the output terminal 414-1 and a fixed voltage, e.g., ground, and a resistor 438-2 with a resistance value of $R_C$ and a current source 440-2 that are connected in series between the output terminal 414-2 and a fixed voltage, e.g., ground.

Each of the buffer elements 430-1 and 430-2 of the passive buffer circuit 402 is a high-speed buffer that isolates the connected input terminal 412-1 or 412-2 from the corresponding CTLE input terminal 316-1 and 316-2. The resistor in each buffer element helps to provide DC level shift. The series-connected capacitor and inductor in each buffer element provide the right resonance frequency to make the passive buffer circuit 402 a high bandwidth buffer. A controlled peaking in the passive buffer circuit 402 will boost the expected CTLE peaking gain as well. The resistor 438-1 with the current source 440-1 operates to adjust DC voltage at the CTLE input 316-1, which is connected to the output terminal 414-1 of the passive buffer circuit 402. Similarly, the other resistor 438-2 with the current source 440-2 operates to adjust DC voltage at the CTLE input 316-2, which is connected to the output terminal 414-2 of the passive buffer circuit 402.

DC voltage at the input terminals 316-1 and 316-1 of the CTLE 306 will be as follow:

$$V_{dc} = V_{CC} - (R_T - R_S) * I_c \quad (1)$$

Thus, $R_C$ value is not playing a role in the equation (1) and has been added to isolate CTLE input terminals, which are high-speed terminals, from capacitive loading of the current sources 440-1 and 440-2 (note that IR drop across $R_C$, $I_C * R_C$, leaves enough headroom for the current sources 440-1 and 440-2). In some implementations, $R_c$ value may equal 0Ω.

As it is seen from equation (1), DC level suffers from variation of supply voltage $V_{CC}$ and non-idealities of resistors and current sources. This variation may be reduced by making each of the current sources 440-1 and 440-2 provide $V_{bg}/R$ current, where $V_{bg}$ is the bandgap voltage that is the most accurate voltage inside the chip on which the passive buffer circuit is implemented and R is a resistor, the same type as the resistors 308-1, 308-2, 438-1 and 438-2, (e.g., poly resistors). However, variations of $V_{CC}$ and $V_{bg}$ and mismatch of resistors will remain. The conventional CTLE 306 is able to handle this variation as common mode voltage, but there might be more sensitive CTLEs that need a more well-controlled DC level.

With respect to equation (1), it is noted here that IR or voltage drop across the resistor 432-1 or 432-2 is "$I_C * R_S$". To keep this IR drop equal to a certain value, $R_S$ can be chosen to be large and $I_C$ can be chosen to be small to consume less DC current to set common mode of the CTLE input.

Figure 5:
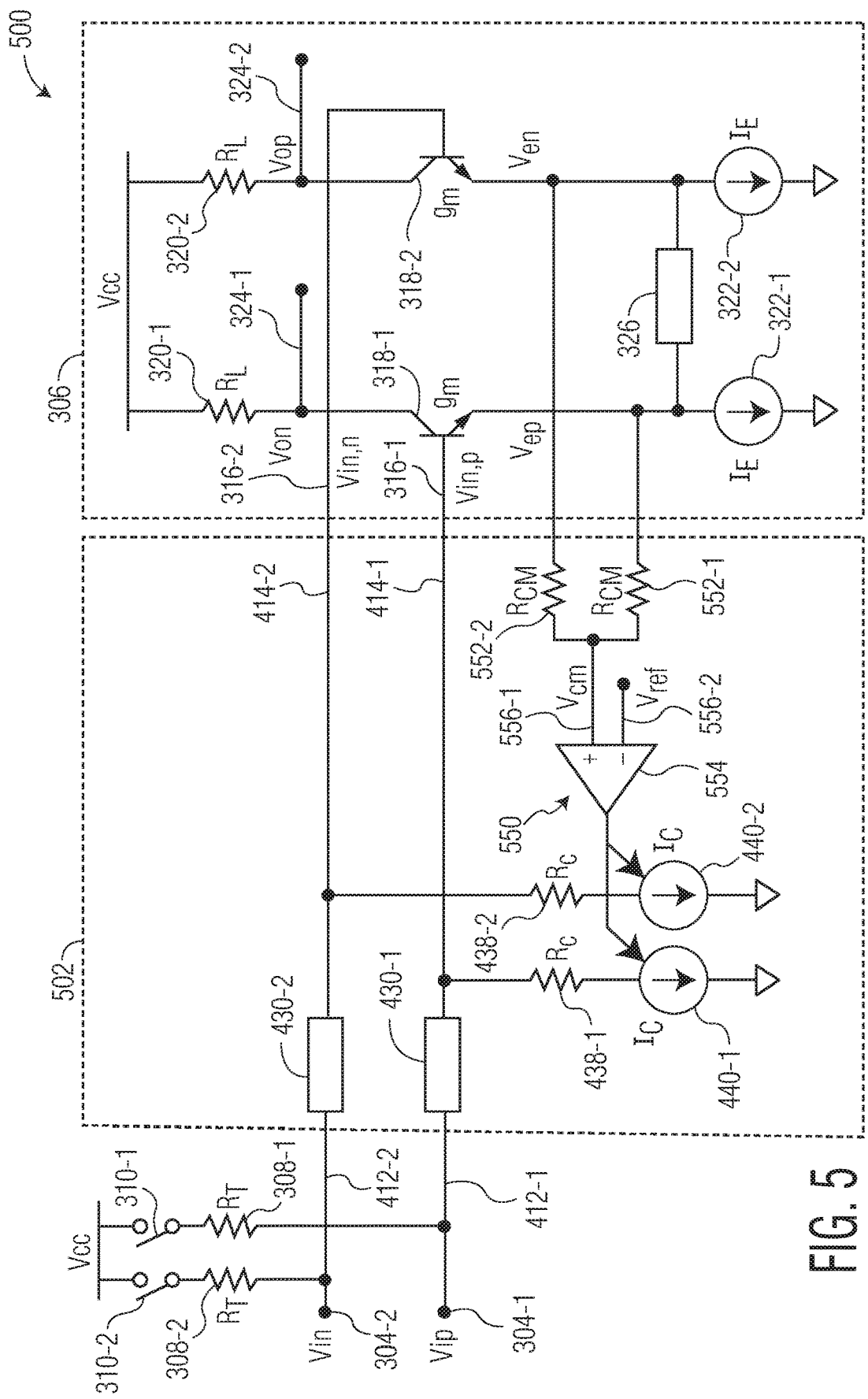
FIG. 5 is a circuit diagram of an input stage of a wideband communication circuit with a passive high bandwidth buffer circuit that provides a well-controlled DC level for the input signals to a continuous-time linear equalizer (CTLE) in accordance with an embodiment of the invention.

Turning now to FIG. 5, an input stage 500 of a wideband communication circuit with a passive high bandwidth buffer circuit 502 that provides a well-controlled DC level for the input signals to the CTLE 306 in accordance with an embodiment of the invention is shown. The passive high bandwidth buffer circuit 502 includes all the components of the passive high bandwidth buffer circuit 402 depicted in FIG. 4. However, the passive high bandwidth buffer circuit 502 further includes a feedback loop 550 connected from the CTLE 306 to the current sources 440-1 and 440-2 of the buffer circuit. The feedback loop 550 includes resistors 552-1 and 552-2 with a resistance value of $R_{CM}$ and an error amplifier 554. One end of the resistor 552-1 is connected to the emitter of the transistor 318-1 of the CTLE 306, while the other end of the resistor 552-1 is connected to an input terminal 556-1 of the error amplifier 554. Similarly, one end of the other resistor 552-2 is connected to the emitter of the transistor 318-2 of the CTLE 306, while the other end of the resistor 552-2 is connected to the same input terminal 556-1 of the error amplifier 554. Thus, the voltage on the input terminal 556-1 of the error amplifier 554 is DC voltage of the emitter voltage $V_{ep}$ of the transistor 318-1 and the emitter voltage $V_{en}$ of the transistor 318-2, which is compared to a reference voltage $V_{ref}$ on the other input terminal 556-2 of the error amplifier 554.

Using the feedback loop 550, DC voltage of the CTLE input signals $V_{in,n}$ and $V_{in,p}$ can be controlled. The resistors 552-1 and 552-2 of the feedback loop 550 provide DC voltage of the emitter voltage $V_{ep}$ of the transistor 318-1 and the emitter voltage $V_{en}$ of the transistor 318-2, which is $V_{cm}$. The error amplifier 554 will force $V_{cm} = V_{ref}$ through the feedback loop 550 by controlling the current sources 440-1 and 440-2 using the output of the error amplifier 554, which will control the DC voltage of the CTLE input signals $V_{in,n}$ and $V_{in,p}$.

Figure 6:
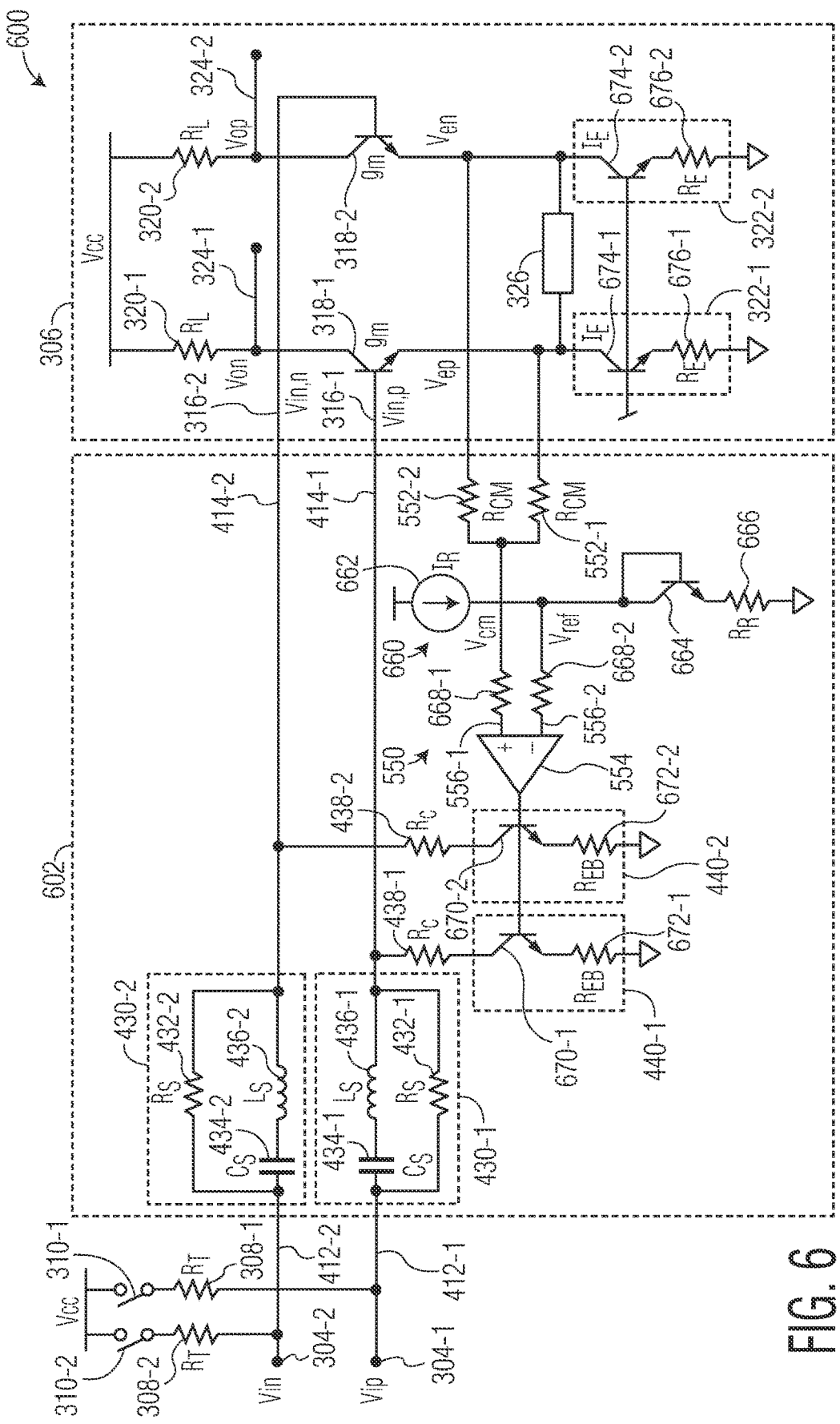
FIG. 6 is a circuit diagram of an input stage of a wideband communication circuit with a passive high bandwidth buffer circuit that provides a well-controlled DC level for the input signals to a CTLE in bipolar junction transistor (BJT) form in accordance with an embodiment of the invention.

Turning now to FIG. 6, an input stage 600 of a wideband communication circuit with a passive high bandwidth buffer circuit 602 that provides a well-controlled DC level for the input signals to the CTLE 306 in accordance with an embodiment of the invention is shown in a complete bipolar junction transistor (BJT) form. In FIG. 6, a reference voltage circuit 660 that provides the reference voltage $V_{ref}$ to the error amplifier 554 is shown. The reference voltage circuit 660 includes a current source 662, which provides current $I_R$, a transistor 664 and a resistor 666 with a resistance value of $R_R$ that connected in series between a supply voltage and a fixed voltage, e.g., ground. In the reference voltage circuit 660, a node between the current source 662 and the transistor 664 provides the reference voltage $V_{ref}$, which is supplied to the error amplifier 554. As illustrated in FIG. 6, each of the input terminals 556-1 and 556-2 of the error amplifier 554 includes a resistor 668-1 or 668-2.

In addition, in the embodiment shown in FIG. 6, components of the current sources 440-1 and 440-2 in the passive buffer 602 are shown. As shown in FIG. 6, the current source 440-1 includes a transistor 670-1 and a resistor 672-1 with a resistance value of $R_{EB}$ that are connected in series between the output terminal 414-1 of the passive buffer 602 and a fixed voltage, e.g., ground. The base of the transistor 670-1 is connected to the output terminal of the error amplifier 554. Similarly, the current source 440-2 includes a transistor 670-2 and a resistor 672-2 with a resistance value of $R_{EB}$ that are connected in series between the output terminal 414-2 of the passive buffer 602 and a fixed voltage, e.g., ground. The base of the transistor 670-2 is also connected to the output terminal of the error amplifier 554.

Also, in FIG. 6, components of the current sources 322-1 and 322-2 in the CTLE 306 are shown. The current source 322-1 includes a transistor 674-1 and a resistor 676-1 with a resistance value of $R_E$ that are connected in series between the transistor 318-1 of the CTLE 306 and a fixed voltage, e.g., ground. Similarly, the current source 322-2 includes a transistor 674-2 and a resistor 676-2 with a resistance value of $R_E$ that are connected in series between the transistor 318-2 of the CTLE 306 and a fixed voltage, e.g., ground.

In the embodiment illustrated in FIG. 6, the reference voltage $V_{ref}$ that is provided by the reference voltage circuit 660 will be as follow:

$$V_{ref}=I_R*R_R+V_{BE} \quad (2)$$

which can be selected to different values by using a programmable $R_R$ or $I_R$.

Figure 7:
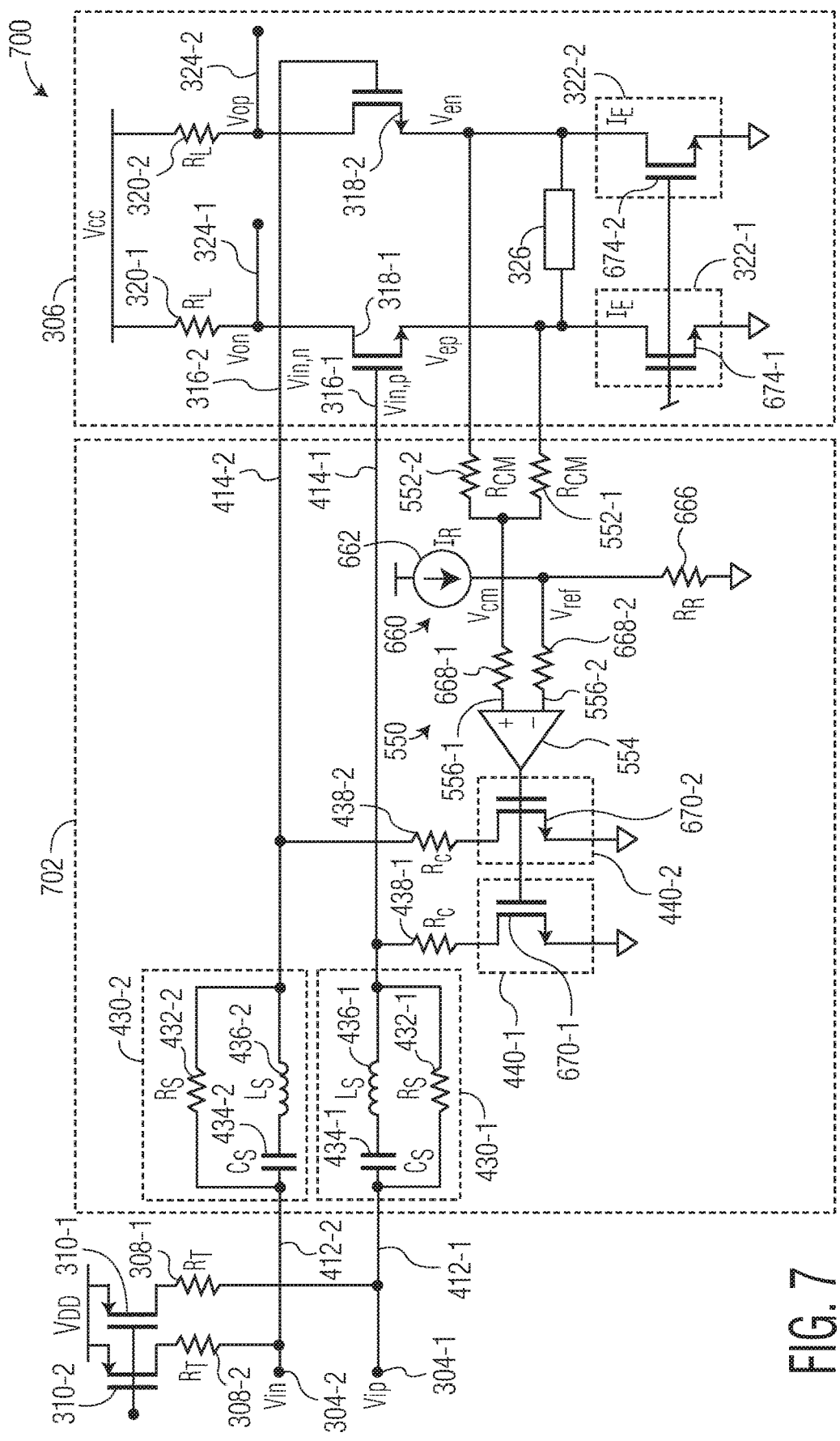
FIG. 7 is a circuit diagram of an input stage of a wideband communication circuit with a passive high bandwidth buffer circuit that provides a well-controlled DC level for the input signals to a CTLE in complementary metal-oxide-semiconductor (CMOS) form in accordance with an embodiment of the invention.

Turning now to FIG. 7, an input stage 700 of a wideband communication circuit with the passive high bandwidth buffer circuit 702 that provides a well-controlled DC level for the input signals to the CTLE 306 in accordance with an embodiment of the invention is shown in a complete complementary metal-oxide-semiconductor (CMOS) form, where all BJT-NPN transistors are replaced with N-type MOS (NMOS) transistors and switches are replaced with P-type MOS (PMOS) transistors.

If the passive buffer circuit, such as the buffer circuit 602 or 702, is being used in a protocol based redriver (e.g., USB3 redriver), the input resistance should be 50Ω when the redriver is on, and greater than 25 KΩ when the redriver is off. The desired input resistance when the redriver is off will be referred to herein as the safe mode resistance $R_{safe}$. Since the capacitors 434-1 and 434-2 of the passive buffer circuit are open DC wise, $R_S$ should be greater than 25 KΩ and the 50Ω termination resistors should be "OFF" in safe mode.

Figure 8:
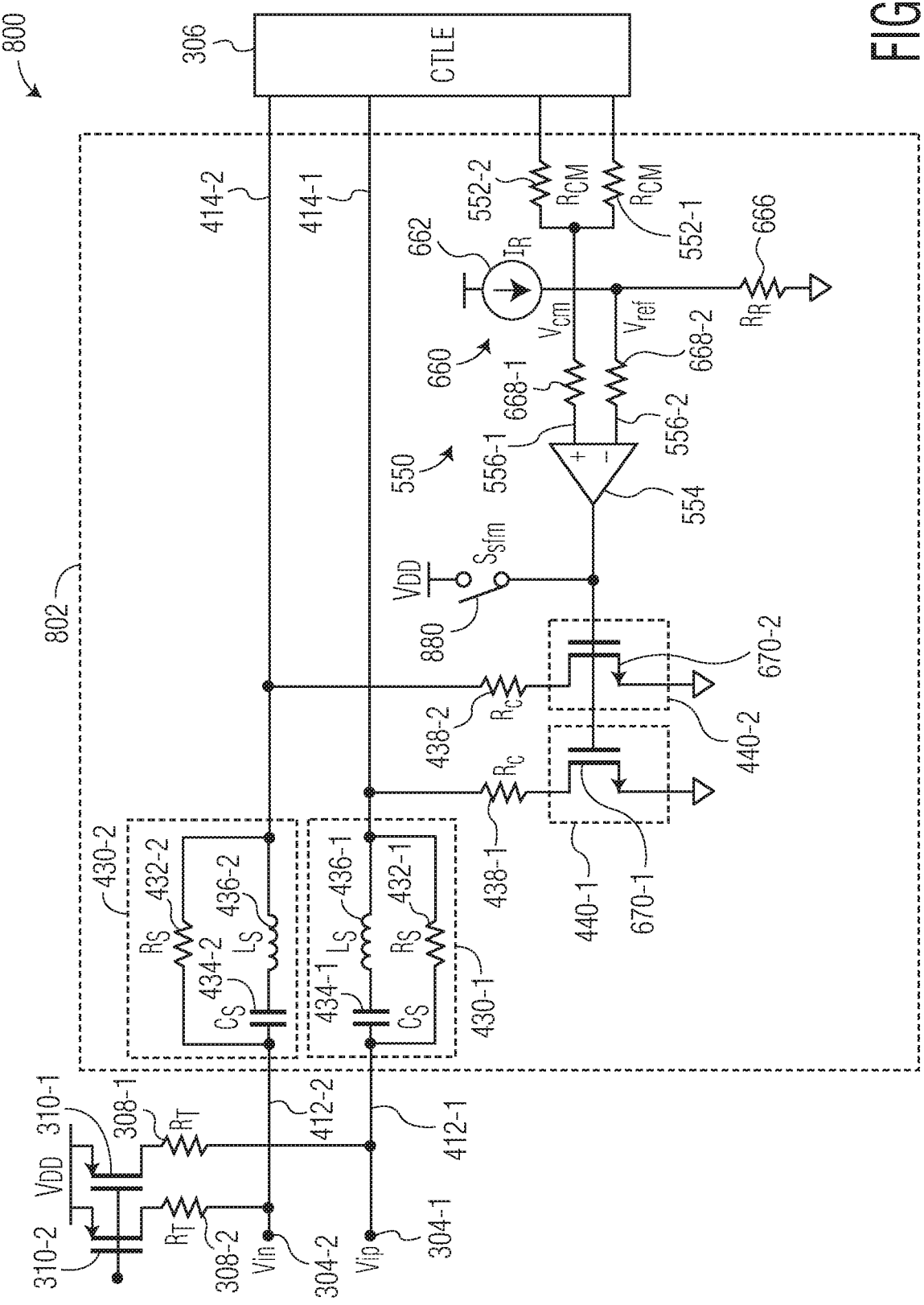
FIG. 8 is a circuit diagram of an input stage of a wideband communication circuit with a passive high bandwidth buffer circuit that provides a safe mode resistance when needed in CMOS form in accordance with an embodiment of the invention.

FIG. 8 shows an input stage 800 of a wideband communication circuit with a passive high bandwidth buffer circuit 802 in CMOS form that provides the safe mode resistance $R_{safe}$ when needed in accordance with an embodiment of the invention. The passive high bandwidth buffer circuit 802 includes all the components of the passive high bandwidth buffer circuit 702 depicted in FIG. 7. However, the passive high bandwidth buffer circuit 802 includes a switch 880 connected to a voltage supply $V_{DD}$ and the output terminal of the error amplifier 554. The 880 switch operates to short the gates of the transistors 670-1 and 670-2 of the current sources 440-1 and 440-2 to use the transistors as switches. Thus, the resistance value $R_{ds,on}$ of the transistor 670-1 or 670-2, which is the resistance across drain and source of the transistor when the transistor is on, is added to the Rs value of the resistor 432-1 or 432-2 so that "$R_{ds,on}+R_s$" is greater than 25 KΩ. Thus, $R_{safe}$, which equals "$R_{ds,on}+R_s$", is greater than 25 KΩ.

Figure 9:
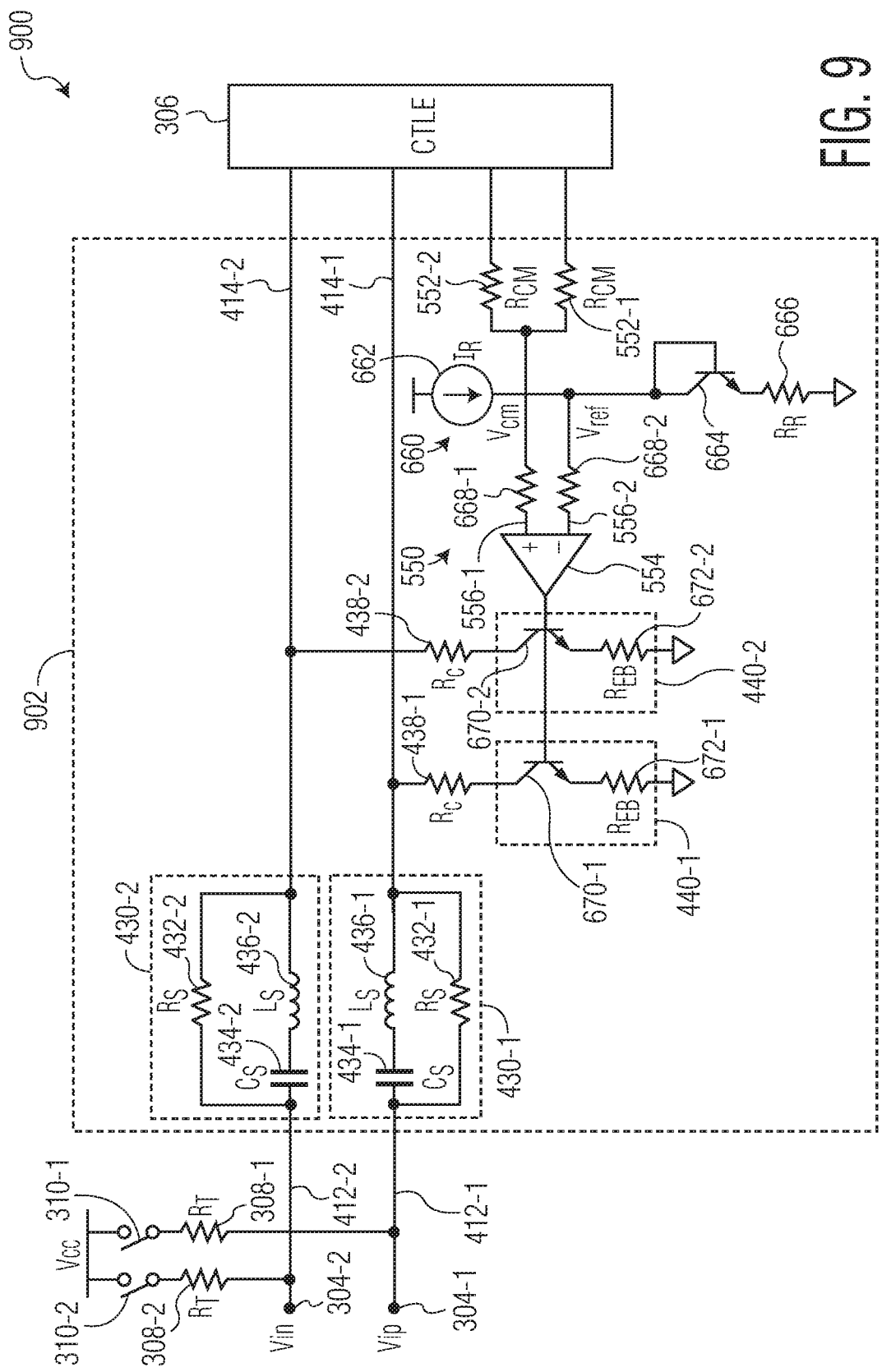
FIG. 9 is a circuit diagram of an input stage of a wideband communication circuit with a passive high bandwidth buffer circuit that provides a safe mode resistance when needed in BJT form in accordance with an embodiment of the invention.

Turning now to FIG. 9, an input stage 900 of a wideband communication circuit with a passive high bandwidth buffer circuit 902 in bipolar form that provides the safe mode resistance $R_{safe}$ when needed in accordance with an embodiment of the invention is shown. In this embodiment, $R_{CE}$ of the transistor 670-1 or 670-2, which is the resistance across the collector and emitter of the transistor, should be considered in the $R_{safe}$ value so that "$R_s+R_{EB}+R_{CE}$", where $R_{CE}$ is the collector-emitter resistance of the transistor 670-1 or 670-2, is greater than 25 KΩ. Thus, $R_{safe}$, which equals "$R_s+R_{EB}+R_{CE}$", is greater than 25 KΩ. $R_{safe}$ will be "$R_s+R_C+R_{EB}+R_{CE}$" when $R_C$ is not equal to zero.

The passive high bandwidth buffer circuit in accordance with various embodiments of the invention may be used with two-dimensional CTLEs or any other CTLE architecture. As an example, the passive high bandwidth buffer circuit may be used with a two-dimensional CTLE disclosed in U.S. Pat. No. 10,447,507, entitled "LOW SUPPLY LINEAR EQUALIZER WITH PROGRAMMABLE PEAKING GAIN", which is incorporated herein by reference. As another example, the passive high bandwidth buffer circuit may be used with a two-dimensional CTLE disclosed in U.S. patent application Ser. No. 17/084,528, entitled "TWO-DIMENSIONAL CONTINUOUS-TIME LINEAR EQUALIZER FOR HIGH-SPEED APPLICATIONS", which is also incorporated herein by reference.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A passive buffer circuit comprising:
   a plurality of buffer elements connected between input terminals of the passive buffer circuit and output terminals of the passive buffer circuit, the output terminals of the passive buffer circuit being connected to input terminals of a communication component circuit with a plurality of input transistors, each of the buffer elements providing a first path with a resistor and a second path with a series-connected capacitor and inductor for signals from the input terminals of the passive buffer circuit to the input terminals of the communication component circuit;
a plurality of current sources connected between the output terminals and at least one fixed voltage; and
a feedback loop from the input transistors of the communication component circuit to the current sources to control direct current (DC) voltage at each of the input terminals of the communication component circuit, the feedback loop including an error amplifier that controls the current sources based on voltages on the input transistors of the communication component circuit with respect to a reference voltage.

2. The passive buffer circuit of claim 1, wherein the feedback loop is connected to input transistors of a continuous-time linear equalizer (CTLE) and wherein the output terminals of the passive buffer circuit are connected to control terminals of the input transistors of the CTLE.

3. The passive buffer circuit of claim 1, wherein the feedback loop further includes first and second resistors that are connected in parallel, each of the first and second resistors being connected between a first input of the error amplifier and one of the input transistors of the communication component circuit.

4. The passive buffer circuit of claim 1, further comprising a reference voltage circuit connected to the error amplifier, the reference voltage circuit including a reference voltage current source and a first resistor connected in series between a supply voltage and a fixed voltage, wherein a node between the reference voltage current source and the first resistor is connected to an input of the error amplifier.

5. The passive buffer circuit of claim 4, wherein the reference voltage circuit further includes a transistor connected between the reference voltage current source and the first resistor.

6. The passive buffer circuit of claim 1, further comprising a first resistor connected between one of the current sources and one of the output terminals and a second resistor connected between another one of the current sources and another one of the output terminals.

7. The passive buffer circuit of claim 1, further comprising a switch connected to an output of the error amplifier and a supply voltage to provide a safe mode input resistance when needed.

8. The passive buffer circuit of claim 1, wherein each of the input terminals of the passive buffer circuit is connected to a termination resistor.

9. A wideband communication circuit comprising:
a passive buffer circuit with input terminals to receive input signals and output terminals to transmit output signals; and
a continuous-time linear equalizer (CTLE) with a plurality of input transistors connected to the output terminals of the passive buffer circuit to equalize the output signals from the passive buffer circuit,
wherein the passive buffer circuit comprises:
a plurality of buffer elements connected between the input terminals of the passive buffer circuit and the output terminals of the passive buffer circuit, the output terminals of the passive buffer circuit being connected to input terminals of the CTLE, each of the buffer elements providing a first path with a resistor and a second path with a series-connected capacitor and inductor for signals from the input terminals of the passive buffer circuit to the input terminals of the CTLE;
a plurality of current sources connected between the output terminals and at least one fixed voltage; and
a feedback loop from the input transistors of the CTLE to the current sources to control direct current (DC) voltage at each of the input terminals of the CTLE, the feedback loop including an error amplifier that controls the current sources based on voltages on the input transistors of the CTLE with respect to a reference voltage.

10. The wideband communication circuit of claim 9, wherein the output terminals of the passive buffer circuit are connected to control terminals of the input transistors of the CTLE.

11. The wideband communication circuit of claim 9, wherein the feedback loop of the passive buffer circuit further includes first and second resistors that are connected in parallel, each of the first and second resistors being connected between a first input of the error amplifier and one of the input transistors of the CTLE.

12. The wideband communication circuit of claim 9, wherein the passive buffer circuit further comprises a reference voltage circuit connected to the error amplifier, the reference voltage circuit including a reference voltage current source and a first resistor connected in series between a supply voltage and a fixed voltage, wherein a node between the reference voltage current source and the first resistor is connected to an input of the error amplifier.

13. The wideband communication circuit of claim 12, wherein the reference voltage circuit of the passive buffer circuit further includes a transistor connected between the reference voltage current source and the first resistor.

14. The wideband communication circuit of claim 9, wherein the passive buffer circuit further comprises a first resistor connected between one of the current sources and one of the output terminals and a second resistor connected between another one of the current sources and another one of the output terminals.

15. The wideband communication circuit of claim 9, wherein the passive buffer circuit further comprises a switch connected to an output of the error amplifier and a supply voltage to provide a safe mode input resistance when needed.

16. The wideband communication circuit of claim 9, wherein each of the input terminals of the passive buffer circuit is connected to a termination resistor.

17. A passive buffer circuit comprising:
first and second buffer elements connected between first and second input terminals of the passive buffer circuit and first and second output terminals of the passive buffer circuit, the first and second output terminals of the passive buffer circuit being connected to input terminals of a communication component circuit with first and second input transistors, each of the first and second buffer elements providing a first path with a resistor and a second path with a series-connected capacitor and inductor for signals from the first and second input terminals of the passive buffer circuit to the input terminals of the communication component circuit;
first and second current sources connected between the first and second output terminals and at least one fixed voltage; and
a feedback loop from the first and second input transistors of the communication component circuit to the current sources to control direct current (DC) voltage at each of the inputs of the communication component circuit, the feedback loop including an error amplifier and first and second feedback loop resistors, the first feedback loop resistor being connected to the first input transistor of the communication component circuit and to a first input of the error amplifier, the second feedback loop resistor being connected to the second input transistor of the communication component circuit and to the first input of the error amplifier, wherein a voltage on the first input of the error amplifier is compared to a reference voltage on a second input of the error amplifier to output an error signal to control the current sources based on voltages on the first and second input transistors of the communication component circuit with respect to the reference voltage.

18. The passive buffer circuit of claim 17, wherein the feedback loop is connected to first and second input transistors of a continuous-time linear equalizer (CTLE) and wherein the first and second output terminals of the passive buffer circuit are connected to control terminals of the input transistors of the CTLE.

19. The passive buffer circuit of claim 17, further comprising a reference voltage circuit connected to the error amplifier, the reference voltage circuit including a reference voltage current source and a first resistor connected in series between a supply voltage and a fixed voltage, wherein a node between the reference voltage current source and the first resistor is connected to the second input of the error amplifier.

20. The passive buffer circuit of claim 17, further comprising a switch connected to an output of the error amplifier and a supply voltage to provide a safe mode input resistance when needed.

* * * * *